United States Patent
Ben-Abu et al.

(10) Patent No.: US 9,723,722 B2
(45) Date of Patent: Aug. 1, 2017

(54) SELECTIVE SOLDER MASK PRINTING ON A PRINTED CIRCUIT BOARD (PCB)

(71) Applicant: CAMTEK LTD., Migdal Haemek (IL)

(72) Inventors: Yehuda Ben-Abu, Netanya (IL); Yair Ozeri, Herzliya (IL)

(73) Assignee: CAMTEK LTD., Migdal Haemeq (IL)

(*) Notice: Subject to any disclaimer, the term of this patent is extended or adjusted under 35 U.S.C. 154(b) by 0 days.

(21) Appl. No.: 15/077,920

(22) Filed: Mar. 23, 2016

(65) Prior Publication Data
US 2016/0286659 A1   Sep. 29, 2016

Related U.S. Application Data

(60) Provisional application No. 62/137,841, filed on Mar. 25, 2015.

(51) Int. Cl.
*H05K 3/00* (2006.01)
*B41J 3/407* (2006.01)

(52) U.S. Cl.
CPC ......... *H05K 3/0079* (2013.01); *H05K 3/0073* (2013.01)

(58) Field of Classification Search
None
See application file for complete search history.

(56) References Cited

U.S. PATENT DOCUMENTS

| | | | | |
|---|---|---|---|---|
| 4,748,742 A | * | 6/1988 | Choinski | H05K 3/0094 156/155 |
| 4,928,387 A | * | 5/1990 | Mather | B23K 35/0222 174/263 |
| 4,976,813 A | * | 12/1990 | Salensky | C08L 71/00 156/230 |

* cited by examiner

*Primary Examiner* — Lisha Jiang
(74) *Attorney, Agent, or Firm* — Reches Patents

(57) ABSTRACT

A method for printing on a substrate, the method may include determining actual locations of substrate holes; printing a first ink on an object at locations that correspond to the actual locations of the substrate holes and curing the first ink to provide a holes mask; and wherein after the substrate is positioned on the object so that holes mask seals bottoms of the substrate holes then printing the second ink on the substrate thereby forming a predefined pattern on the substrate.

17 Claims, 3 Drawing Sheets

SELECTIVE SOLDER MASK PRINTING ON A PRINTED CIRCUIT BOARD (PCB)

CROSS REFERENCE TO RELATED APPLICATIONS

This patent application claims the priority of U.S. provisional patent Ser. No. 62/137,841 filed Mar. 25, 2015, which is incorporated herein by reference.

BACKGROUND OF THE INVENTION

Currently in regular process of electrical circuits manufacturing such as PCB, non-conductive layer (such as Solder Mask for example) cannot be applied till the edge of the drill holes or Through silicon vias (TSV-s) or other holes in the substrate due to the fact that it blocks the hole and creates an air bubbles in the hole—this air bubble can explode in the process of soldering that leads to malfunction of the electrical circuit and wastage of the material. The current solution of the problem is to clog the holes with the clogging material and applying the solder mask over the clogged holes—this way of production requires an additional work and waste of time and human resources.

SUMMARY OF THE INVENTION

According to an embodiment of the invention there may be provided a method for printing on a substrate, may include determining actual locations of substrate holes; printing a first ink on an object at locations that correspond to the actual locations of the substrate holes; curing the first ink to provide a holes mask; wherein after the substrate is positioned on the object so that holes mask seals bottoms of the substrate holes then printing the second ink on the substrate thereby forming a predefined pattern on the substrate.

The first ink may equal the second ink or may differ from the second ink.

The determining of the actual locations of the substrate holes may include ignoring holes in the substrate that may be smaller than a predefined size threshold.

The printing of the first ink on the object at locations that correspond to the actual locations of the substrate holes exhibits a first accuracy level; wherein the printing of the first ink on the object thereby forming the predefined pattern on the substrate exhibits a second accuracy level.

The second accuracy level may be higher than the first accuracy level.

The second accuracy level equals the first accuracy level.

The object may be a paper sheet.

The method wherein a thickness of the object may be a fraction of the thickness of the substrate.

The object may be elastic.

The substrate may be a printed circuit board.

The first ink and/or the second ink may be a solder mask ink.

The holes mask may include multiple holes mask segments, wherein at least one holes mask segment may be configured to cover more than a substrate hole.

The determining of the locations of the substrate holes may include searching the substrate holes in an image of the substrate.

The searching the substrate holes may be preceded by acquiring the image of the substrate.

The acquiring the image of the substrate may be followed by removing the substrate from a supporting module of an imaging system and placing the object on the supporting module.

The printing of the first ink on the object at locations that correspond to the actual locations of the substrate holes may involve jetting ink drops of a first size; wherein the printing of the second ink on the substrate involves jetting ink drops of a second size that exceeds the first size.

The printing of the first ink on the object at locations that correspond to the actual locations of the substrate holes may exhibit a first printing speed; wherein the printing of the second ink on the substrate thereby forming the predefined pattern on the substrate may exhibit a second printing speed that may be lower than the first printing speed.

According to an embodiment of the invention there may be provided a system that may include a controller, a printing unit, a curing unit and a supporting module; wherein the controller may be configured to determine actual locations of substrate holes or to receive information about the actual locations of the substrate holes; wherein the printing unit may be configured to print, under a control of the controller, a first ink on an object at locations that correspond to the actual locations of the substrate holes; wherein the curing unit may be configured to cure the first ink to provide a holes mask; wherein after the substrate may be positioned on the object so that holes mask seals bottoms of the substrate holes the printing unit may be configured to print the second ink on the substrate thereby forming a predefined pattern on the substrate.

The system further may include an imaging unit that may be configured to acquire an image of the substrate; and wherein the controller may be configured to search in the image of the substrate for the substrate holes.

BRIEF DESCRIPTION OF THE INVENTION

The present invention will be understood and appreciated more fully from the following detailed description taken in conjunction with the drawings in which.

DETAILED DESCRIPTION OF THE INVENTION

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

In the following specification, the invention will be described with reference to specific examples of embodiments of the invention. It will, however, be evident that various modifications and changes may be made therein without departing from the broader spirit and scope of the invention as set forth in the appended claims.

The method allows to print non-conductive layer (such as printing Solder Mask) till the edge of the hole (of the drill or TSV or any other type) without contaminating the other side of the substrate and to achieve high precision application.

It is noted that the solder mask ink and the non-conductive ink mentioned below are just non-limiting examples of inks that can be printing on the substrate and on the object. Using the same printing unit to print over the object and the substrate is effective and increases the throughput of the system.

Figure 1:
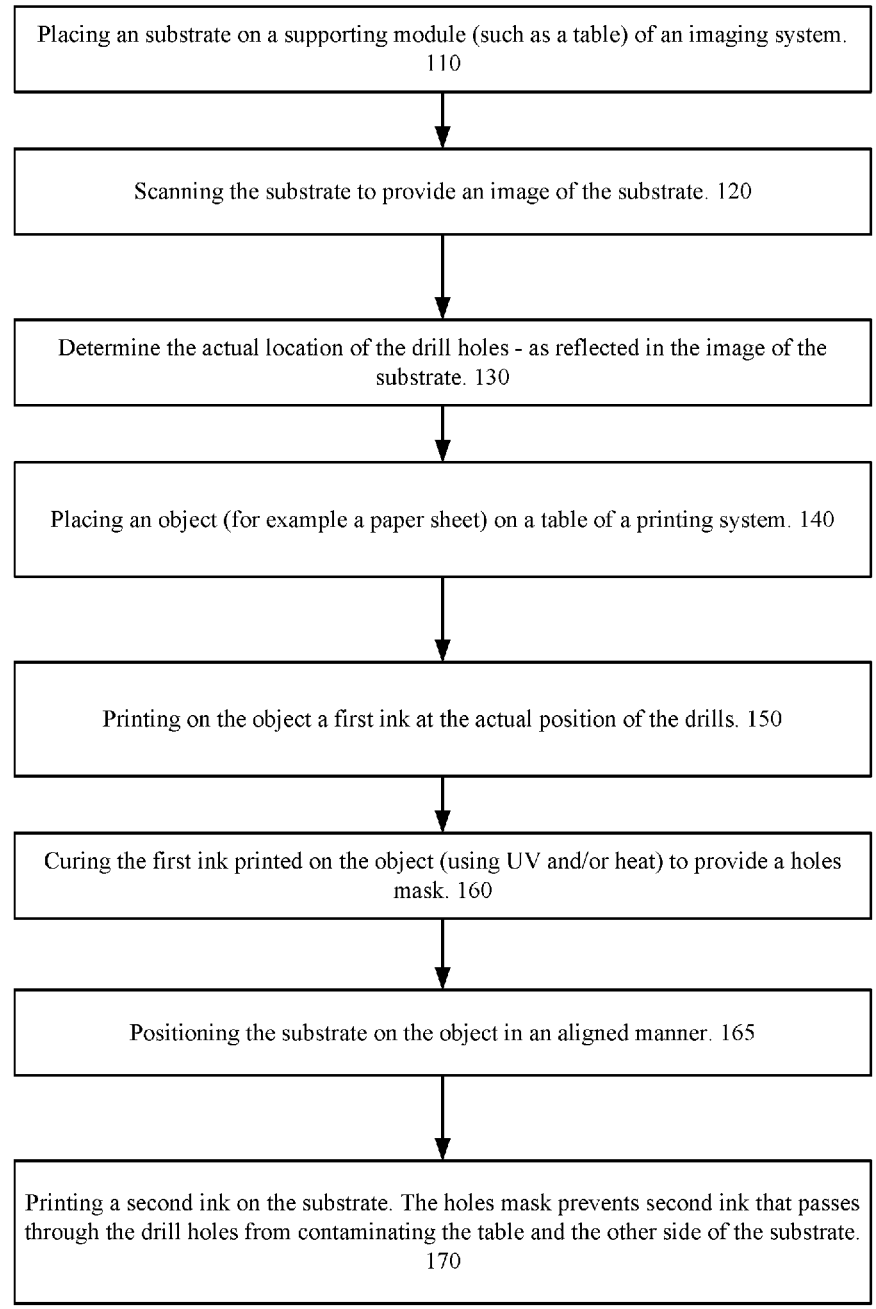
FIG. 1 illustrates a method according to an embodiment of the invention.

The method (see FIG. 1) may include the following steps:

a. Placing the substrate (e.g. PCB) on a supporting module (such as a table) of an imaging system. (Step 110).
b. Scanning the substrate to provide an image of the substrate. (Step 120).
c. Determine the actual location of the holes—as reflected in the image of the substrate. (Step 130).
d. Placing an object (such as a sheet) on a table (or other supporting element) of a printing system. (Step 140). The printing system may differ from the imaging system. Alternatively, a single system may perform both the printing and the imaging. The object may be a porous or non-porous object. A non-limiting example of an object is a paper object. The object may be elastic or not elastic. Using an elastic object such as a paper object may allow a tighter connection of the object to the substrate and increase the efficiency of a holes mask that is formed on the object during step 150. The object may be much thinner (a fraction—1/N, N being a positive number that exceeds one) than the substrate.
e. Printing on the object a first ink (for example—a non-conductive ink such as solder mask ink) at the actual position of the holes. (Step 150). The first ink may cover areas that are bigger than the cross section of the actual hole drill. Step 150 may be less accurate, use larger ink drops, and/or be faster than the printing of step 170.
f. Curing the first ink printed on the object (using UV and/or heat). (Step 160).
g. Positioning the substrate on the object in an aligned manner. The object is positioned below the substrate in a manner that prevents a relative movement between the object and the substrate during the next step of printing. (Step 165). The object may be attached to the substrate and/or to a system by various means including clips, screws, grip arms and the like. The positioning can be made by a user of the system and/or by the system itself. The alignment can be done by the user, by the system, by the system that provides instructions to the user, by using images (acquired by the imaging unit) of the object and the substrate, by using alignment targets, and the like.
h. Printing a second ink (for example—a non-conductive ink such as a solder mask ink) on the object to provide a predefined pattern. The holes mask will seal the bottom of the drill holes and will prevent the second ink from contaminating the table or the bottom surface of the substrate. (Step 170). The second ink may be cured by the system.

The method may include comparing the actual location of the holes to the expected locations and generating an updated design file.

The method may include ignoring holes of the substrate that are small enough (below a predefine size)—for example that are small enough so that air bubbles are not formed, smaller than drill holes and/or smaller than Through silicon vias (TSVs), holes that are not deep enough or that to not pass through the entire substrate.

Figure 2:
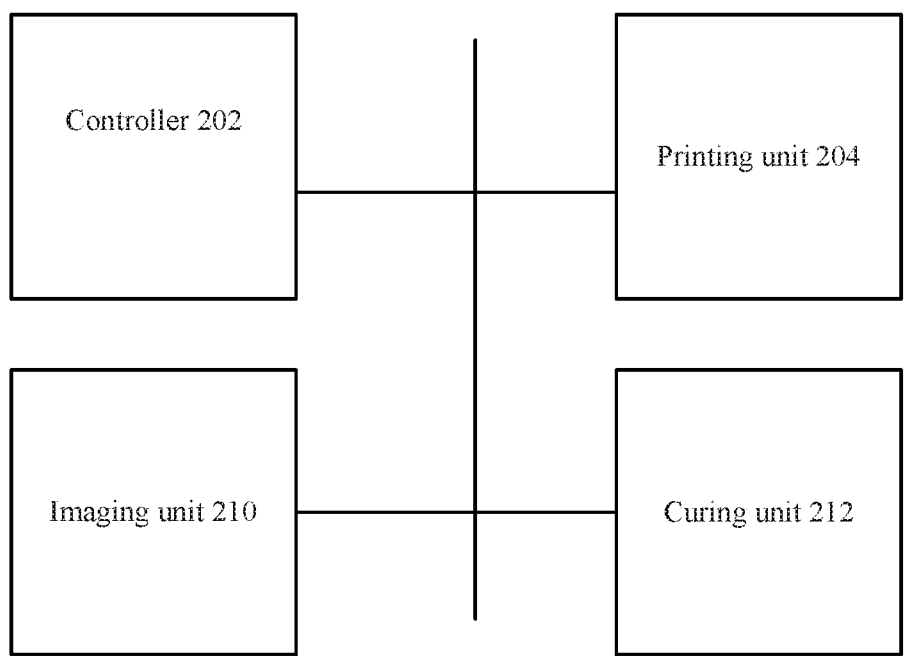
FIG. 2 illustrates a system according to an embodiment of the invention.

FIG. 2 illustrates a system 200 according to an embodiment of the invention.

System 200 may execute method 100.

System 200 includes controller 202, printing unit 204, imaging unit 210, curing unit 212 and a mechanical support such as table 220.

Controller 202 determines where to print the first ink and the second ink on the object (such as sheet) 303 and controls the printing steps 150 and 170 that are executed by printing unit 204. The curing unit 212 may cure the first ink and the second ink—during step 160 and after step 170. The imaging unit 210 images the substrate (Step 120).

Figure 3:
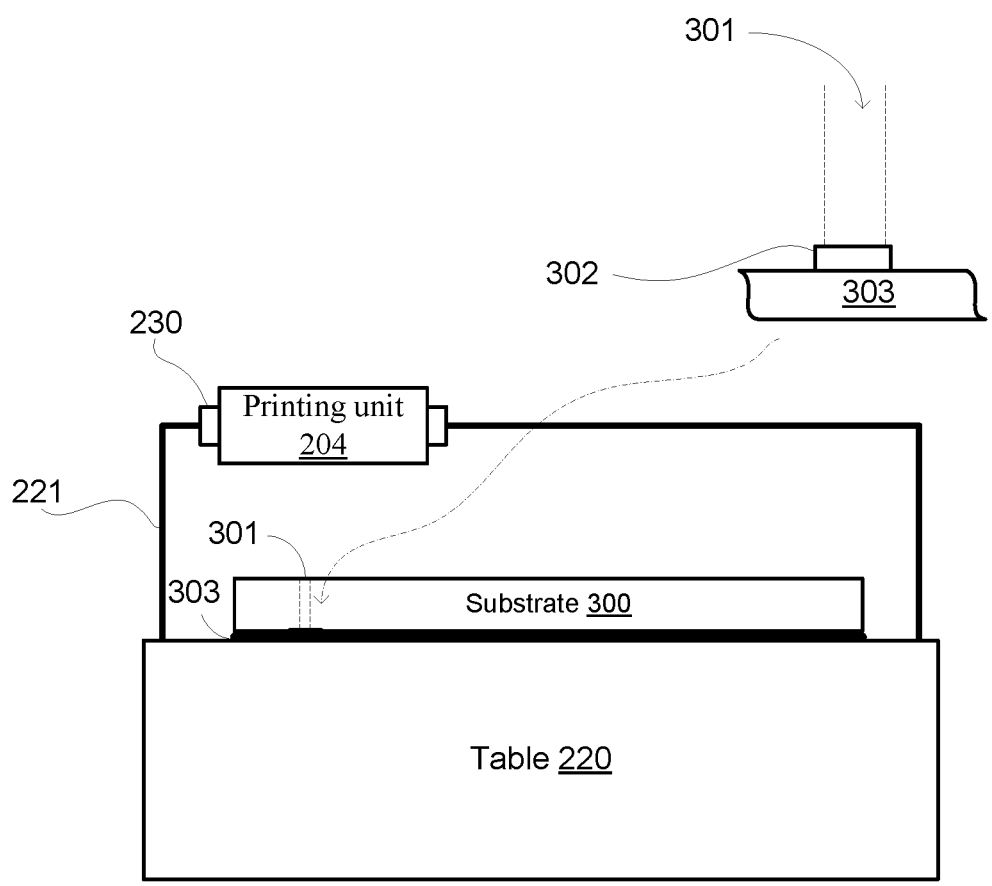
FIG. 3 is a side view of a table of the system of FIG. 2, a porous object and a substrate according to an embodiment of the invention.

FIG. 3 is a cross sectional view of system 200, substrate 300 and object 303 according to an embodiment of the invention.

Substrate 300 includes a drill hole 301. A bottom of the drill hole 301 is sealed by hole mask 302 that is printed on object 303.

Table 220 supports the object 303 that is positioned below the substrate 300.

A bridge 221 may be connected to the table 220 or to another components of the system 200 and may be mechanically coupled to a motor 230. Motor 230 is configured to introduce movement (for example from right to left and vise verse) between printing unit 204 and the bridge 221. The curing unit and/or the imaging unit may be coupled to the bridge 221. The system may include one or more bridges.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

However, other modifications, variations, and alternatives are also possible. The specifications and drawings are, accordingly, to be regarded in an illustrative rather than in a restrictive sense.

The word "comprising" does not exclude the presence of other elements or steps then those listed in a claim. It is understood that the terms so used are interchangeable under appropriate circumstances such that the embodiments of the invention described herein are, for example, capable of operation in other orientations than those illustrated or otherwise described herein.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe.

Thus, these terms are not necessarily intended to indicate temporal or other prioritization of such elements. The mere fact that certain measures are recited in mutually different claims does not indicate that a combination of these measures cannot be used to advantage.

We claim:

1. A method for printing on a substrate, comprising:
   determining actual locations of substrate holes;
   printing a first ink on an object at locations that correspond to the actual locations of the substrate holes and curing the first ink to provide a holes mask;
   wherein, after the substrate is positioned on the object so that holes mask seals bottoms of the substrate holes, printing a second ink on the substrate thereby forming a predefined pattern on the substrate.

2. The method according to claim 1 wherein the first ink equals the second ink.

3. The method according to claim 1 wherein the first ink differs from the second ink.

4. The method according to claim 1 wherein the determining the actual locations of the substrate holes comprises ignoring holes in the substrate that are smaller than a predefined size threshold.

5. The method according to claim 1 wherein the printing of the first ink on the object at locations that correspond to the actual locations of the substrate holes exhibits a first accuracy level; wherein the printing of the second ink on the object thereby forming the predefined pattern on the substrate exhibits a second accuracy level that is higher than the first accuracy level.

6. The method according to claim 1 wherein the printing of the first ink on the object at locations that correspond to the actual locations of the substrate holes exhibits a first accuracy level; wherein the printing of the second ink on the object thereby forming the predefined pattern on the substrate exhibits a second accuracy level that equals the first accuracy level.

7. The method according to claim 1 wherein the object is a paper sheet.

8. The method according to claim 1 wherein the thickness of the object is a fraction of the thickness of the substrate.

9. The method according to claim 1 wherein the object is elastic.

10. The method according to claim 1 wherein the substrate is a printed circuit board.

11. The method according to claim 1 wherein at least one of the first and second inks is a solder mask ink.

12. The method according to claim 1 wherein the holes mask comprises multiple holes mask segments, wherein at least one holes mask segment is configured to cover more than a substrate hole.

13. The method according to claim 1 wherein the determining of the locations of the substrate holes comprises searching the substrate holes in an image of the substrate.

14. The method according to claim 13 wherein the searching the substrate holes is preceded by acquiring the image of the substrate.

15. The method according to claim 14 wherein the acquiring the image of the substrate is followed by removing the substrate from a supporting module of an imaging system and placing the object on the supporting module.

16. The method according to claim 1 wherein the printing of the first ink on the object at locations that correspond to the actual locations of the substrate holes involves jetting ink drops of a first size; wherein the printing of the second ink on the substrate involves jetting ink drops of a second size that exceeds the first size.

17. The method according to claim 1 wherein the printing of the first ink on the object at locations that correspond to the actual locations of the substrate holes exhibits a first printing speed; wherein the printing of the second ink on the substrate thereby forming the predefined pattern on the substrate exhibits a second printing speed that is lower than the first printing speed.

* * * * *